United States Patent
Lee et al.

(10) Patent No.: US 7,639,561 B2
(45) Date of Patent: Dec. 29, 2009

(54) MULTI-PORT MEMORY DEVICE HAVING VARIABLE PORT SPEEDS

(75) Inventors: Dongyun Lee, San Jose, CA (US); Myung Rai Cho, San Jose, CA (US); Sungjoon Kim, Cupertino, CA (US)

(73) Assignee: Silicon Image, Inc., Sunnyvale, CA (US)

(*) Notice: Subject to any disclaimer, the term of this patent is extended or adjusted under 35 U.S.C. 154(b) by 223 days.

(21) Appl. No.: 11/694,813

(22) Filed: Mar. 30, 2007

(65) Prior Publication Data

US 2007/0245094 A1 Oct. 18, 2007

Related U.S. Application Data

(60) Provisional application No. 60/788,401, filed on Mar. 30, 2006.

(51) Int. Cl.
*G11C 8/18* (2006.01)
(52) U.S. Cl. .............. 365/233.11; 365/233.1; 365/233.12
(58) Field of Classification Search ........... 365/230.05, 365/233.1, 233.11, 233.12, 233.15
See application file for complete search history.

(56) References Cited

U.S. PATENT DOCUMENTS

| | | | | |
|---|---|---|---|---|
| 5,144,314 A | * | 9/1992 | Malmberg et al. | 342/44 |
| 6,002,633 A | * | 12/1999 | Oppold et al. | 365/230.03 |
| 6,118,792 A | * | 9/2000 | Beshai | 370/468 |
| 6,167,487 A | * | 12/2000 | Camacho et al. | 711/131 |
| 6,263,390 B1 | | 7/2001 | Alasti et al. | |
| 6,396,324 B1 | * | 5/2002 | Hsu et al. | 327/298 |
| 6,795,360 B2 | * | 9/2004 | Duh et al. | 365/221 |
| 7,369,453 B2 | * | 5/2008 | Kim | 365/230.05 |
| 7,405,995 B2 | * | 7/2008 | Ishimoto et al. | 365/230.05 |
| 7,433,263 B2 | * | 10/2008 | Kim | 365/233.1 |
| 2003/0056061 A1 | | 3/2003 | Sherman | |

(Continued)

FOREIGN PATENT DOCUMENTS

EP 1209563 5/2002

(Continued)

OTHER PUBLICATIONS

First Examination Report as received in related European Patent Application No. EP07759902.5 on Feb. 26, 2009, (9 pages).

(Continued)

*Primary Examiner*—Tuan T Nguyen
*Assistant Examiner*—Hien N Nguyen
(74) *Attorney, Agent, or Firm*—Blakely, Sokoloff, Taylor & Zafman

(57) ABSTRACT

A multi-port memory device having two or more ports wherein each port may operate at a different speed. The multi-port memory device contains memory banks that may be accessed via the two or more ports. Two clock signals are applied to each port: a system clock and a port clock. The system clock is applied to port logic that interfaces with the memory banks so that the ports all operate at a common speed with respect to the memory banks. The port clock is applied to a clock divider circuit that is associated with each port. The port clock is divided to a desired frequency or kept at its original frequency. Such a configuration allows the ports to operate at different speeds that may be set on a port-by-port basis.

15 Claims, 4 Drawing Sheets

U.S. PATENT DOCUMENTS

2003/0126424 A1     7/2003    Horanzy et al.
2008/0074936 A1*   3/2008    Kim et al. .............. 365/189.15

OTHER PUBLICATIONS

First Examination Report as received in related European Patent Application No. EP07759905.8 on Mar. 26, 2009, (6 pages).

International Preliminary Report on Patentability and Written Opinion as received in related PCT Application No. PCT/US2007/065727 on Oct. 9, 2008, (9 pages).

International Preliminary Report on Patentability and Written Opinion as received in related PCT Application No. PCT/US2007/065723 on Oct. 9, 2008, (8 pages).

* cited by examiner

MULTI-PORT MEMORY DEVICE HAVING VARIABLE PORT SPEEDS

CROSS-REFERENCE TO RELATED APPLICATIONS

This application claims priority to U.S. Provisional Patent Application No. 60/788,401 entitled "INTEGRATED MULTI-PORT SERIAL MEMORY AND INTER-PROCESSOR COMMUNICATION," and filed on Mar. 30, 2006, which is hereby incorporated by reference.

BACKGROUND

As mobile phones, portable media players, personal digital assistants, and other mobile devices have proliferated, manufacturers have continually improved the features that are offered to device users. Offering additional features has typically required manufacturers to increase the processing power of devices. In current mobile devices, for example, it is not uncommon for the device to contain multiple computer processors or other processing elements. For example, mobile phones often contain a baseband processor, a media processor, and an LCD controller. Each of the processing components in a mobile device may access various memory areas in which an operating system or other applications are stored. The processing components may communicate with the memory and with other components at different communication rates and using different communication protocols.

As mobile devices have continued to shrink in size, manufacturers have needed to optimize the device architectures in order to minimize the number of components that are contained within a device. Size reductions are often achieved by combining the functionality from many semiconductor components into a single semiconductor component. When manufacturers sought to reduce the number of components that are contained within a mobile device, however, several problems arose that were particularly acute in a multi-processor environment. First, having several processing components communicating with a single memory component required a mechanism to ensure that all components would have access to the memory device. Such a challenge has been mitigated by the introduction of multi-port memory devices, such as the multi-port device disclosed in U.S. patent application Ser. No. 10/045,297, entitled "Communications Architecture for Memory-Based Devices", filed Nov. 7, 2001, and incorporated herein in its entirety by this reference. A multi-port memory architecture allows accessing components to communicate with a common shared memory through dedicated ports. Second, the various processing components in a mobile device may communicate with each other and with memory devices at different data rates. When using numerous components, manufacturers were able to select a memory device having a speed that matched the requirements of the processing component to which it was connected. By reducing the component count, however, an incompatibility can arise between transmission and reception communication speeds of processing components and memory devices. It would therefore be advantageous to develop a multi-port memory device that is suitable for communicating with a wide variety of processing components at various data communication speeds.

DETAILED DESCRIPTION

A multi-port memory device having two or more ports wherein each port may operate at a different speed is disclosed. The multi-port memory device contains memory banks that may be accessed via the two or more ports. Two clock signals are applied to each port: a system clock and a port clock. The system clock is applied to port logic that interfaces with the memory banks so that the ports all operate at a common speed with respect to the memory banks. The port clock is applied to a clock divider circuit that is associated with each port. The port clock is divided to a desired frequency or kept at its original frequency. Such a configuration allows the ports to operate at different speeds that may be set on a port-by-port basis. Components coupled to the ports may therefore communicate at different data rates with the memory device, thereby increasing the number of applications in which the memory device may be used.

Various examples of a multi-port memory device with variable speed ports will now be described. The following description provides specific details for a thorough understanding and enabling description of these examples. One skilled in the art will understand, however, that the technology may be practiced without many of these details. Additionally, some well-known structures or functions may not be shown or described in detail, so as to avoid unnecessarily obscuring the relevant description of the various examples. The terminology used in the description presented below is intended to be interpreted in its broadest reasonable manner, even though it is being used in conjunction with a detailed description of certain specific examples of the technology. Certain terms may even be emphasized below; however, any terminology intended to be interpreted in any restricted manner will be overtly and specifically defined as such in this Detailed Description section.

Figure 1:
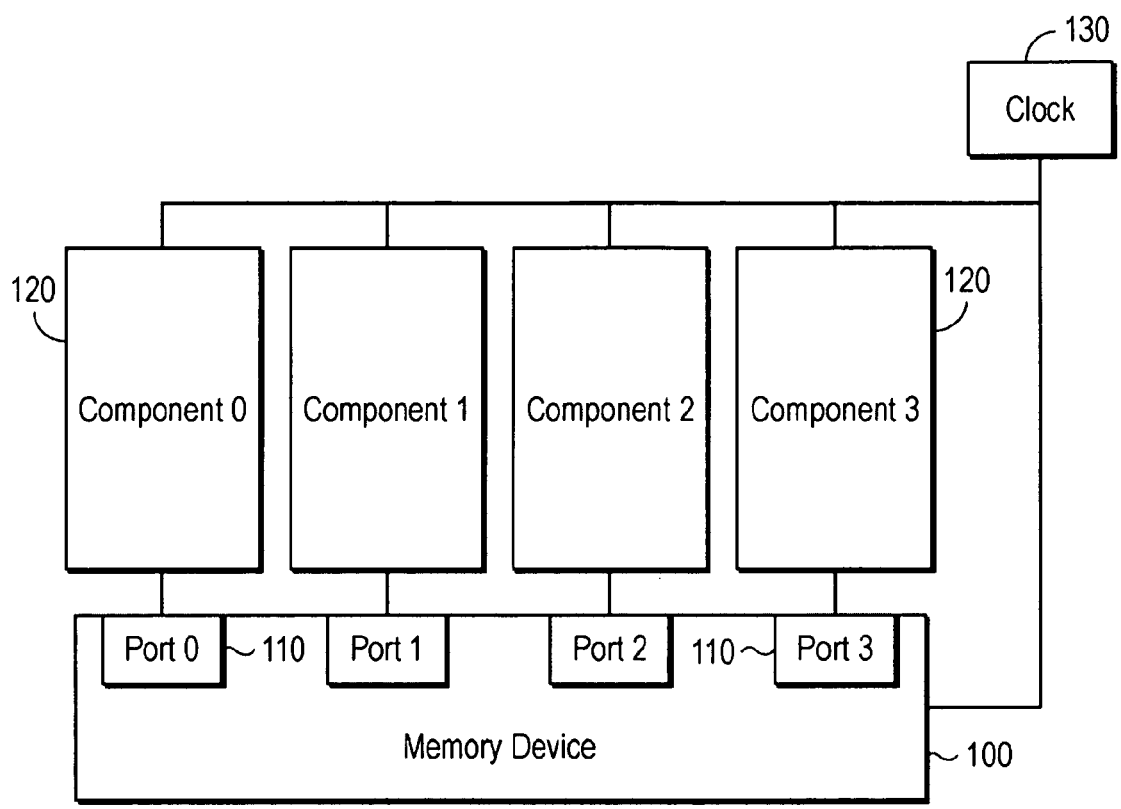
FIG. 1 is a block diagram of a representative environment in which a multi-port memory device having variable port speeds may operate.

FIG. 1 is a block diagram of an environment in which a multi-port memory device 100 having variable speed ports may operate. The multi-port memory device contains two or more serial ports 110, each port being couplable to a system component 120. The system component can be any type of component that uses shared memory, such as a baseband processor, media processor, or LCD controller, and may act as a port master to configure and control the port. The memory device 100 contains one or more banks of memory (not shown) that store data that may be accessed via the ports. The banks of memory may be made up of dynamic random access memory (DRAM) or other common types of memory. A system component sends and receives data to the memory device through the corresponding port to which it is connected. Data is communicated serially between the system components and the ports, and in parallel between the ports and the banks of memory. A system clock 130 provides a common clocking signal that may be used by the memory device 100 and the components 120. Each component has a clock circuit (not shown) with appropriate bandwidth and jitter requirements. As will be described herein, the system clock may be selectively divided at each port 110 so that each of the ports operates at a desired speed. Configuring the port speed on a port-by-port basis allows the port speed to be optimized to a corresponding component 120 that is attached to a port. While the communication between a port and attached component occurs at a configured speed, communication between the ports inside of the memory device occurs at a common speed.

Figure 2:
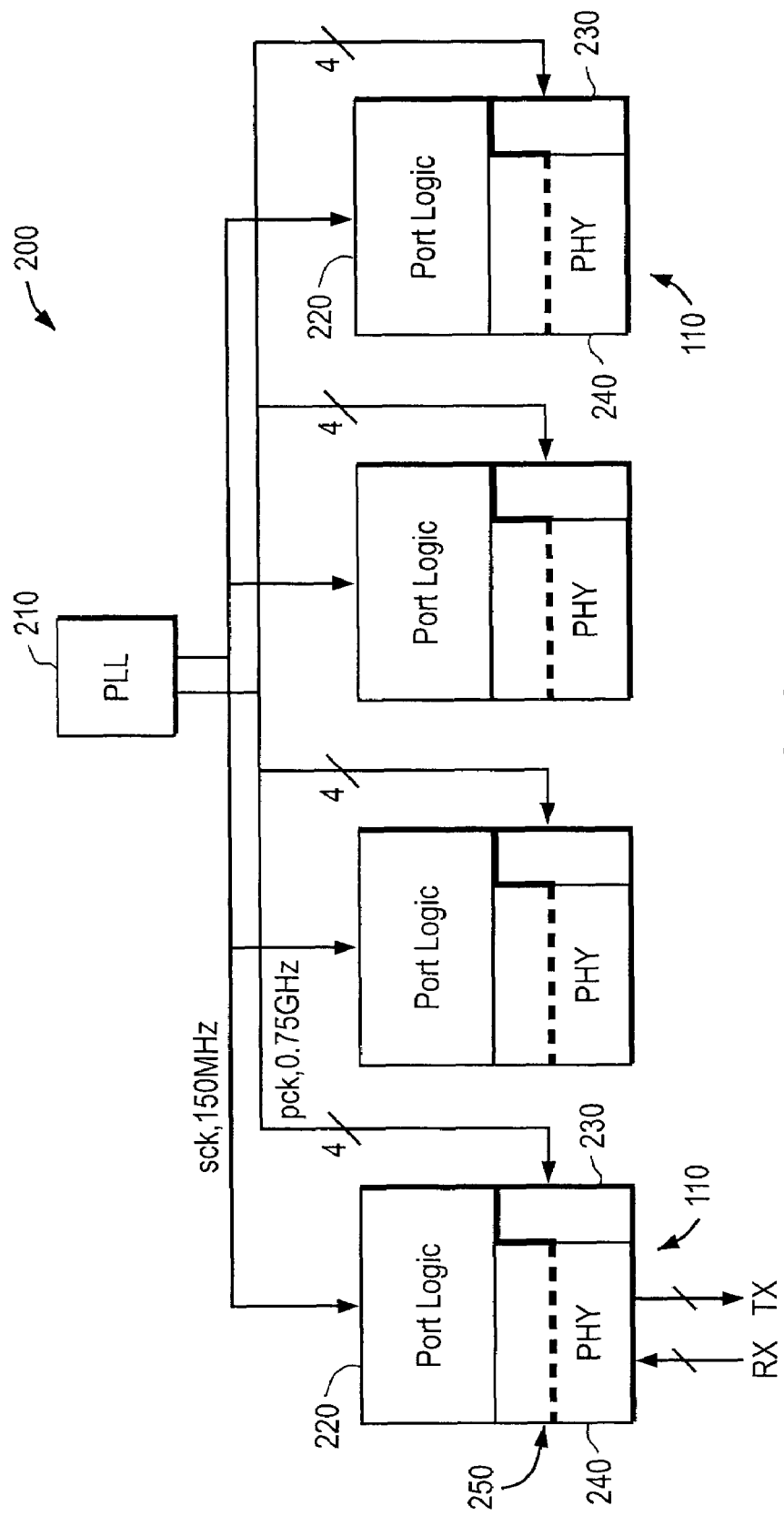
FIG. 2 is a block diagram of a clock distribution system for ports in a multi-port memory device.

FIG. 2 is a block diagram of a clock distribution system for the ports in the multi-port memory device. A phase-locked loop 210 generates two clock signals that are distributed to the ports 110: a system clock (sck) and a port clock (pck). The system clock is applied to the port logic 220 of each port, such as the parallel processing and communication of data from the port to the memory banks, enabling all port logic to operate at a common speed. The port clock is applied to a clock divider circuit 230 that is associated with each port. As will be described in additional detail herein, the clock divider circuit selectively modifies the port clock to a desired clock frequency on a port-by-port basis. Modifying the port clock frequency on a port-by-port basis enables various physical-layer components 240 of the port, such as the analog portion and the serial to parallel conversion of data at the port, to operate at a desired speed. As a result, the transmit and receive components of each port may be configured to operate with a coupled system component on a port-by-port basis. A clock domain boundary 250 is depicted in the figure to conceptually show that a portion of the physical layer operates at the local port clock speed and a portion of the physical layer operates at the system clock speed. In the system depicted in FIG. 2, the system clock speed is 150 MHz and the port clock speed is 750 MHz, although the system and port clock speeds may be varied to suit the system in which the disclosed architecture is utilized. Moreover, although a clock divider circuit 230 is depicted in the figure as being present at each port, it will be appreciated that only some of the ports in a multi-port memory device may include the clock divider circuit.

Figure 3:
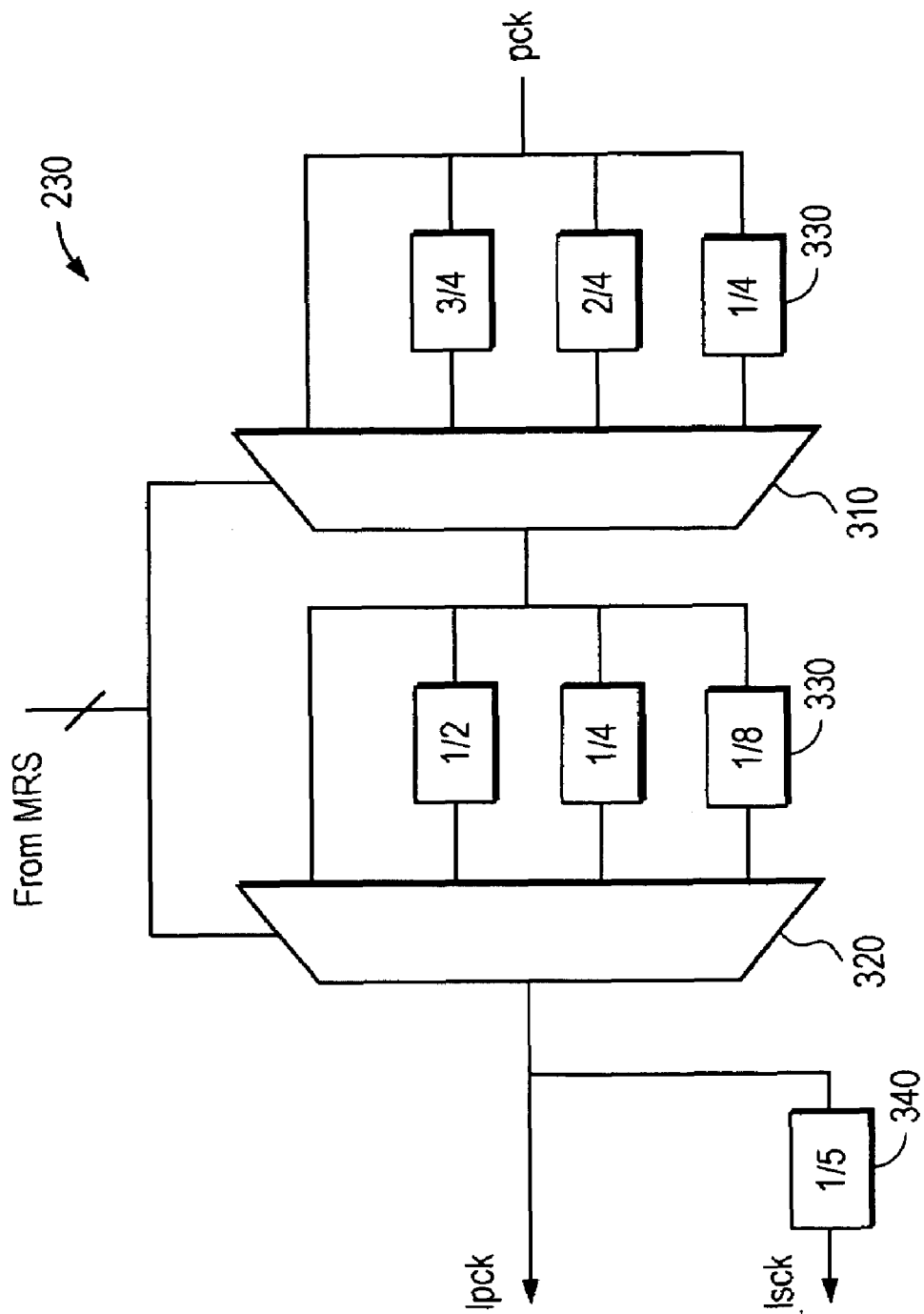
FIG. 3 is a circuit diagram of a clock divider circuit that divides a clock signal to achieve a desired clock frequency.

FIG. 3 is a circuit diagram of the clock divider circuit 230 that divides a clock signal to a desired frequency. The divider circuit comprises two multiplexers 310, 320 that are connected in series, and a number of clock dividers 330 that each divide the clock frequency by a fixed amount. In some embodiments, multiplexers 310 and 320 are 4-to-1 multiplexers. The port clock (pck) is directly connected to one input of the first multiplexer 310, and is connected to each of the other inputs of the first multiplexer through a set of clock dividers. In the implementation depicted in FIG. 3, the clock dividers associated with the three inputs have values of ¾, 2/4, and ¼. In such an implementation, the first multiplexer may output a clock signal at the original port clock frequency, or the first multiplexer may output a clock signal that is reduced in frequency to either 75%, 50%, or 25% of the original port clock frequency. The output of the first multiplexer is determined by the setting of a mode register (MRS). The output of the first multiplexer is directly connected to one input of the second multiplexer 320, and is connected to the other inputs of the second multiplexer through a set of clock dividers. In the depicted implementation, the clock dividers associated with the second multiplexer have values of ½, ¼, and ⅛. The output of the second multiplexer is also determined by the setting of the mode register (MRS). The output of the second multiplexer is a local port clock (lpck). Depending on the settings of the first and second multiplexer, the local port clock may range from the same frequency as the port clock (pck) to 1/32 of the frequency of the port clock in the depicted embodiment.

In some embodiments, it may be desirable for the local port clock to have the same frequency as the system clock. To enable such a configuration, a clock divider 340 is coupled to the output of the second multiplexer 320. Clock divider 340 divides the local port clock by five. If the first and second multiplexers are set so that the local port clock (lpck) is the same frequency as the port clock (pck), then in the depicted embodiment pf FIGS. 2 and 3, dividing the local port clock by five will generate a clock having the same frequency as the system clock (spk) (i.e., 750 MHz divided by five produces a 150 MHz clock signal).

While FIG. 3 depicts a clock divider circuit with two multiplexers and certain clock divider values, the configuration of the circuit may be modified depending on the particular application. The number of multiplexers, the number of inputs to each multiplexer, and the number and value of the clock dividers may all be varied depending on the application and the desired clock speeds. In some embodiments, the value of the clock dividers 330 may be adjustable.

Figure 4:
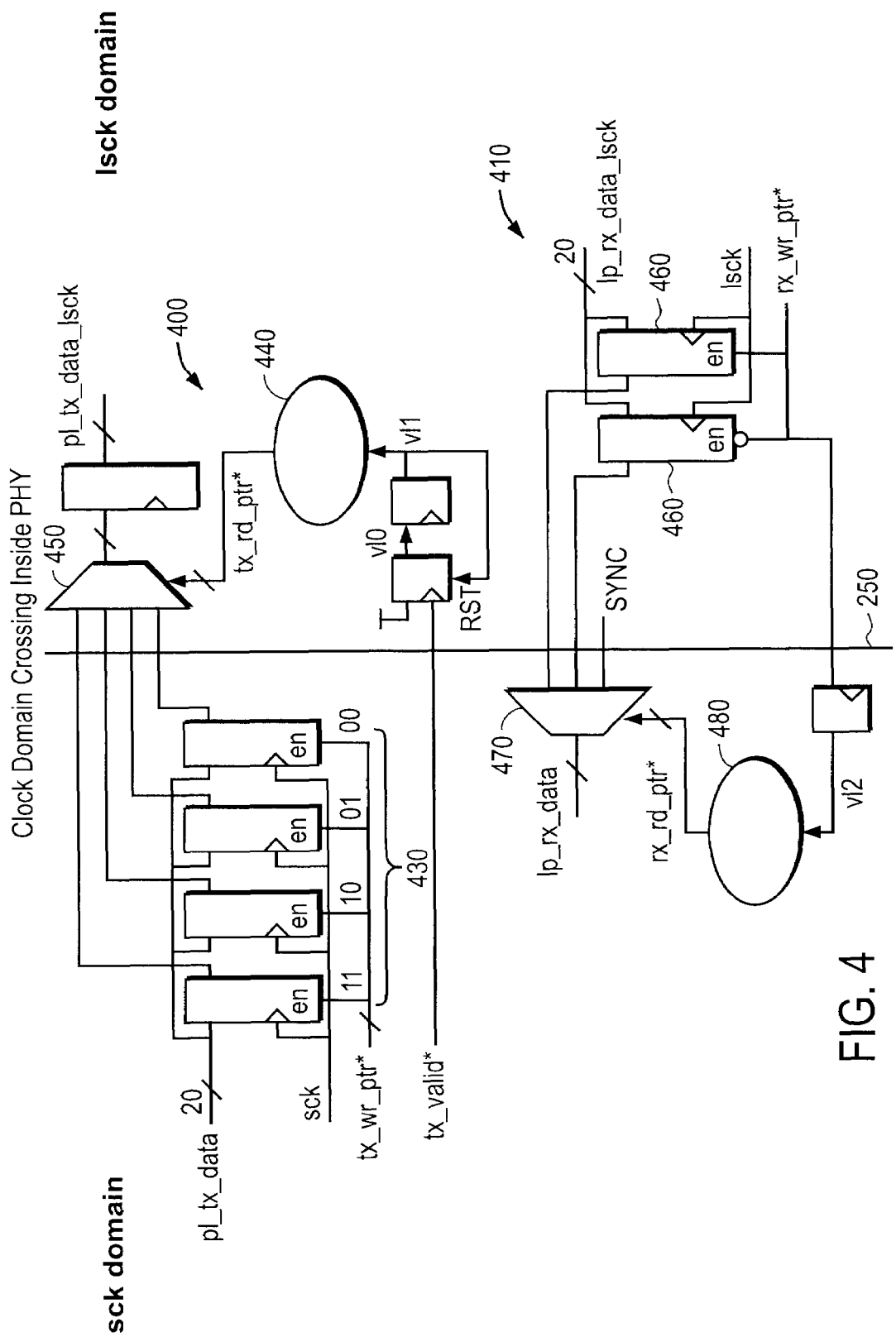
FIG. 4 is a circuit diagram of a transmit circuit and a receive circuit that extend across a clock boundary in a multi-port memory device.

FIG. 4 is a circuit diagram of a transmit circuit 400 and a receive circuit 410 that extend across the clock domain boundary 250 in the multi-port memory device. The portions of the circuits to the left of the clock domain boundary 250 in the figure operate in the system clock (sck) domain. The portions of the circuits to the right of the clock domain boundary 250 operate in the local system clock (lsck) domain.

The transmit circuit 400 is comprised of a set of four registers 430 that sequentially latch data that is received on the pl_tx_data lines. Bursts of data are received in four segments sized in accordance with the registers. The outputs from each of the registers are coupled to the inputs of a 4-to-1 multiplexer 450. A finite state machine 440 steps through the sequence 00, 01, 10, 11 and applies the sequence to the multiplexer 450 in order to select the output from each of the registers in sequence. The finite state machine sequence is only generated when the tx_valid signal is detected. Data is thereby transmitted on the pl_tx_data_lsck lines. To avoid overflow of the registers, new data is received only when the previous four-segment burst of data has been processed.

The receive circuit 410 is comprised of a pair of registers 460 that latch data that is received on the lp_rx_data_lsck lines. The rx_wr_ptr signal alternates between 0 and 1, causing received data to be alternately latched into each register. Two registers are used to ensure that a read command does not overlap with a write command for data in a particular register. The outputs from each of the registers are coupled to the inputs of a multiplexer 470. A finite state machine 480 generates and applies a sequence to the multiplexer in order to select the appropriate output from the registers 460 and provide the received data on the lp_rx_data lines.

When the multi-port memory device is first powered-up, all of the ports may be configured to operate at the highest speed setting available to each port. A port master may then selectively modify one or more of the ports to configure the ports for a desired application. In some embodiments, a supervising port master may configure all of the ports of a device.

Unless described otherwise below, aspects of the invention may be practiced with conventional systems. Thus, the construction and operation of the various blocks shown in the figures may be of conventional design, and need not be described in further detail herein to make and use the invention, because such blocks will be understood by those skilled in the relevant art. Aspects of the system may be implemented using computer-executable instructions, such as program modules, executed by one or more computers or other devices. Generally, program modules include routines, programs, objects, components, data structures, and so on that perform particular tasks or implement particular abstract data types. Typically, the functionality of the program modules may be combined or distributed as desired in various embodiments.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A multi-port memory device comprising:
   a plurality of memory banks;
   a clock distribution network for distributing a system clock signal and a port clock signal within the memory device, the system clock signal having a signal clock frequency and the port clock signal having a port clock frequency; and
   a plurality of ports connected to the clock distribution network and providing access to the plurality of memory banks, wherein the system clock signal and the port clock signal are applied to each of the plurality of ports, and wherein each of the plurality of ports includes an associated clock divider circuit that receives the port clock signal and uses the port clock signal to generate a local port clock signal for the respective port at a local port clock frequency, the local port clock signal being utilized by the associated port to operate at the local port clock frequency;
   wherein each of the ports includes a physical layer, the physical layer of each port including a first portion that operates at the local port clock frequency and a second portion that operates at the system clock frequency.

2. The multi-port memory device of claim 1, wherein the clock divider circuit of each port includes a plurality of multiplexers connected in series.

3. The multi-port memory device of claim 2, wherein the clock divider circuit of each port modifies the port clock signal by each multiplexer of the clock divider circuit receiving an input clock signal and either outputting the input clock signal or dividing the input clock signal by a chosen amount to output a signal with a reduced frequency.

4. The multi-port memory device of claim 3, wherein the local port clock frequency is a fraction of the port clock frequency.

5. The multi-port memory device of claim 1, wherein communication between each of the plurality of ports and each of the plurality of memory banks occurs at the system clock frequency.

6. The multi-port memory device of claim 5, wherein communication between each of the plurality of ports and any component coupled to the respective port occurs at the local port clock frequency.

7. The multi-port memory device of claim 1, wherein communication between the plurality of ports and the plurality of memory banks occurs in parallel.

8. The multi-port memory device of claim 1, wherein communication between the plurality of ports and one or more components coupled to the plurality of ports occurs in serial.

9. The multi-port memory device of claim 1, wherein the local port clock frequency of each of the plurality of ports may be varied on a port-by-port basis.

10. The multi-port memory device of claim 1, further comprising a controller coupled to the clock divider circuit of each port, wherein the controller determines the modification that is made to the port clock signal by the clock divider circuit.

11. The multi-port memory device of claim 10, wherein the controller is a control register.

12. The multi-port memory device of claim 1, wherein the physical layer of each port further includes a transmit circuit and a receive circuit.

13. The multi-port memory device of claim 12, wherein a first part of the transmit circuit and a first part of the transmit circuit of each physical layer is located in the first portion of the physical layer and a second part of the transmit circuit and a second part of the transmit circuit of the physical layer is located in the second portion of the physical layer.

14. The multi-port memory device of claim 13, wherein the first part of the transmit circuit includes a plurality of registers to latch data from the plurality of memory banks, and wherein the second part of the transmit circuit includes a multiplexer to select an output of one of the plurality of registers.

15. The multi-port memory device of claim 13, wherein the second part of the receive circuit includes a plurality of registers to latch data received on the port, and wherein the first part of the receive circuit includes a multiplexer to choose an output of one of the plurality of registers.

* * * * *